United States Patent
Czamara et al.

(10) Patent No.: US 9,992,913 B1
(45) Date of Patent: *Jun. 5, 2018

(54) RACK SYSTEM COOLING WITH INCLINED COMPUTING DEVICES

(71) Applicant: Amazon Technologies, Inc., Reno, NV (US)

(72) Inventors: Michael Phillip Czamara, Seattle, WA (US); Osvaldo P. Morales, Seattle, WA (US); Peter George Ross, Olympia, WA (US)

(73) Assignee: Amazon Technologies, Inc., Reno, NV (US)

( * ) Notice: Subject to any disclaimer, the term of this patent is extended or adjusted under 35 U.S.C. 154(b) by 331 days.

This patent is subject to a terminal disclaimer.

(21) Appl. No.: 14/163,939

(22) Filed: Jan. 24, 2014

Related U.S. Application Data

(63) Continuation of application No. 13/103,860, filed on May 9, 2011, now Pat. No. 8,638,553, which is a continuation-in-part of application No. 12/751,212, filed on Mar. 31, 2010, and a continuation-in-part of application No. 12/751,206, filed on Mar. 31, 2010, now Pat. No. 8,755,192.

(51) Int. Cl.
*H05K 7/20* (2006.01)
*G06F 1/20* (2006.01)

(52) U.S. Cl.
CPC ........... *H05K 7/20736* (2013.01); *G06F 1/20* (2013.01); *G06F 2200/201* (2013.01)

(58) Field of Classification Search
CPC .. G06F 1/20; G06F 2200/201; H05K 7/20736
See application file for complete search history.

(56) References Cited

U.S. PATENT DOCUMENTS

| | | | |
|---|---|---|---|
| 3,834,423 | A | 9/1974 | Elson |
| 3,915,477 | A | 10/1975 | Timmons |
| 4,082,092 | A | 4/1978 | Foster |

(Continued)

FOREIGN PATENT DOCUMENTS

| | | |
|---|---|---|
| EP | 0741269 | 11/1996 |
| EP | 2053911 | 4/2009 |

(Continued)

OTHER PUBLICATIONS

U.S. Appl. No. 11/535,180, filed Sep. 26, 2006, Osvaldo Patricio Morales.

(Continued)

*Primary Examiner* — Adrian S Wilson
(74) *Attorney, Agent, or Firm* — Robert C. Kowert; Meyertons, Hood, Kivlin, Kowert & Goetzel, P.C.

(57) ABSTRACT

A data center includes one or more racks, one or more computing devices coupled to at least one of the racks, and one or more air moving devices. The computing devices include heat producing components. The computing devices may be inclined in the rack such that the lower ends of the computing devices are at a lower elevation than the higher ends of the computing devices. The air moving devices can move air from the lower end of the inclined computing devices to the higher end of the inclined computing devices such that heat is removed from heat producing components in the inclined computing devices.

20 Claims, 9 Drawing Sheets

(56) References Cited

U.S. PATENT DOCUMENTS

| | | | |
|---|---|---|---|
| 4,448,111 A | 5/1984 | Doherty | |
| 5,208,722 A | 5/1993 | Ryan et al. | |
| 5,294,049 A | 3/1994 | Trunkle et al. | |
| 5,506,750 A | 4/1996 | Carteau et al. | |
| 5,518,277 A | 5/1996 | Sanders | |
| 5,621,890 A | 4/1997 | Notarianni et al. | |
| 5,772,500 A | 6/1998 | Harvey et al. | |
| 5,796,580 A | 8/1998 | Komatsu et al. | |
| 5,822,184 A | 10/1998 | Rabinovitz | |
| 5,871,396 A | 2/1999 | Shen | |
| 6,141,986 A | 11/2000 | Koplin | |
| 6,259,605 B1 | 7/2001 | Schmitt | |
| 6,330,161 B1* | 12/2001 | Smith | G06F 1/181 16/225 |
| 6,364,009 B1 | 4/2002 | Macmanus et al. | |
| 6,425,417 B1 | 7/2002 | Paschke | |
| 6,459,579 B1 | 10/2002 | Farmer et al. | |
| 6,499,609 B2 | 12/2002 | Patriche et al. | |
| 6,563,704 B2 | 5/2003 | Grouell et al. | |
| 6,603,661 B2 | 8/2003 | Smith et al. | |
| 6,621,693 B1 | 9/2003 | Potter et al. | |
| 6,625,020 B1 | 9/2003 | Hanson et al. | |
| 6,767,280 B1 | 7/2004 | Berger et al. | |
| 6,791,836 B2 | 9/2004 | Cipolla et al. | |
| 6,795,314 B1 | 9/2004 | Arbogast et al. | |
| 6,859,366 B2 | 2/2005 | Fink | |
| 6,960,130 B2 | 11/2005 | Gebke et al. | |
| 7,003,966 B2 | 2/2006 | Sharma et al. | |
| 7,010,392 B2 | 3/2006 | Bash et al. | |
| 7,031,154 B2 | 4/2006 | Bash et al. | |
| 7,035,111 B1 | 4/2006 | Lin et al. | |
| 7,042,722 B2 | 5/2006 | Suzuki et al. | |
| 7,112,131 B2 | 9/2006 | Rasmussen et al. | |
| 7,197,433 B2 | 3/2007 | Patel et al. | |
| 7,238,104 B1 | 7/2007 | Greenslade et al. | |
| 7,257,956 B2 | 8/2007 | Shimada et al. | |
| 7,278,273 B1 | 10/2007 | Whitted et al. | |
| 7,283,358 B2 | 10/2007 | Campbell et al. | |
| 7,346,913 B2 | 3/2008 | Ishimine et al. | |
| 7,379,299 B2 | 5/2008 | Walsh et al. | |
| 7,434,413 B2 | 10/2008 | Wruck | |
| 7,500,911 B2 | 3/2009 | Johnson et al. | |
| 7,542,288 B2 | 6/2009 | Lanus | |
| 7,660,116 B2 | 2/2010 | Claassen et al. | |
| 7,701,710 B2 | 4/2010 | Tanaka et al. | |
| 7,733,666 B2 | 6/2010 | Ichihara et al. | |
| 7,764,498 B2 | 7/2010 | Conn | |
| 7,804,685 B2 | 9/2010 | Krietzman | |
| 7,869,210 B2 | 1/2011 | Moss | |
| 7,929,300 B1 | 4/2011 | Bisbikis et al. | |
| 7,990,700 B2 | 8/2011 | Guo | |
| 8,139,358 B2* | 3/2012 | Tambe | G06F 1/20 165/104.33 |
| 8,154,870 B1 | 4/2012 | Czamara et al. | |
| 8,339,778 B2* | 12/2012 | Hughes | G06F 1/187 361/679.33 |
| 8,630,087 B1* | 1/2014 | Reynov | H05K 7/20563 361/679.5 |
| 8,638,553 B1* | 1/2014 | Czamara | H05K 7/20736 361/679.48 |
| 2001/0029163 A1 | 10/2001 | Spinazzola et al. | |
| 2002/0021557 A1 | 2/2002 | Ish imine et al. | |
| 2002/0100736 A1 | 8/2002 | Lopez | |
| 2003/0030991 A1* | 2/2003 | Riddiford | G06F 1/183 361/724 |
| 2003/0147219 A1* | 8/2003 | Chou | G11B 33/128 361/725 |
| 2004/0020224 A1 | 2/2004 | Bash et al. | |
| 2004/0165349 A1 | 8/2004 | Arbogast et al. | |
| 2004/0218355 A1 | 11/2004 | Bash et al. | |
| 2005/0166860 A1 | 8/2005 | Austin et al. | |
| 2005/0188689 A1 | 9/2005 | Juby et al. | |
| 2005/0207134 A1* | 9/2005 | Belady | H05K 1/14 361/796 |
| 2005/0228618 A1 | 10/2005 | Patel et al. | |
| 2005/0237716 A1 | 10/2005 | Chu et al. | |
| 2006/0059937 A1 | 3/2006 | Perkins et al. | |
| 2006/0274496 A1 | 12/2006 | Lee et al. | |
| 2007/0074525 A1 | 4/2007 | Vinson et al. | |
| 2007/0101746 A1 | 5/2007 | Schlom et al. | |
| 2007/0213000 A1 | 9/2007 | Day | |
| 2007/0240433 A1 | 10/2007 | Manole | |
| 2008/0007911 A1* | 1/2008 | Hallin | G06F 1/181 361/679.47 |
| 2008/0013275 A1 | 1/2008 | Beckley et al. | |
| 2008/0029250 A1 | 2/2008 | Carlson et al. | |
| 2008/0055846 A1 | 3/2008 | Clidaras et al. | |
| 2008/0094797 A1 | 4/2008 | Coglitore et al. | |
| 2008/0112127 A1 | 5/2008 | June et al. | |
| 2008/0232064 A1 | 9/2008 | Sato et al. | |
| 2008/0259566 A1 | 10/2008 | Fried | |
| 2008/0285232 A1 | 11/2008 | Claassen et al. | |
| 2008/0305733 A1 | 12/2008 | Noteboom et al. | |
| 2009/0061755 A1 | 3/2009 | Calder et al. | |
| 2009/0086441 A1 | 4/2009 | Randall et al. | |
| 2009/0321105 A1 | 12/2009 | Sawyer | |
| 2010/0024445 A1 | 2/2010 | Cichanowicz | |
| 2010/0091458 A1 | 4/2010 | Mosier et al. | |
| 2010/0097760 A1* | 4/2010 | Azar | H01L 23/4735 361/695 |
| 2010/0149754 A1 | 6/2010 | Chapel et al. | |
| 2012/0092811 A1 | 4/2012 | Chapel et al. | |

FOREIGN PATENT DOCUMENTS

| | | |
|---|---|---|
| WO | 9834450 | 8/1998 |
| WO | 2008143503 | 11/2008 |

OTHER PUBLICATIONS

U.S. Appl. No. 12/751,209, filed Mar. 31, 2010, Michael P. Czamara.
U.S. Appl. No. 12/163,146, filed Jun. 27, 2008, Osvaldo P. Morales.
U.S. Appl. No. 12/886,437, filed Sep. 20, 2010, Peter G. Ross.
U.S. Appl. No. 12/886,472, filed Sep. 20, 2010, Peter G. Ross.
U.S. Appl. No. 12/886,469, filed Sep. 20, 2010, Peter G. Ross.
U.S. Appl. No. 11/956,849, filed Dec. 14, 2007, Osvaldo P. Morales.
U.S. Appl. No. 12/646,417, filed Dec. 23, 2009, Michael P. Czamara.
U.S. Appl. No. 12/341,137, filed Dec. 28, 2008, Jonathan David Hay.
U.S. Appl. No. 12/751,212, filed Mar. 31, 2010, Michael P. Czamara.
U.S. Appl. No. 12/886,440, filed Sep. 20, 2010, Peter GRoss et al.
U.S. Appl. No. 13/103,860, filed Jan. 28, 2014, Michael P. Czamara.

* cited by examiner

RACK SYSTEM COOLING WITH INCLINED COMPUTING DEVICES

CONTINUING APPLICATION INFORMATION

This application is a Continuation of U.S. patent application Ser. No. 13/103,860, "Rack System Cooling with Inclined Computing Devices", filed May 9, 2011, which is incorporated by reference in its entirety and is a Continuation-In-Part of each of the following applications:
 a. U.S. patent application Ser. No. 12/751,212, "Rack-Mounted Air Directing Device with Scoop", filed Mar. 31, 2010, which is incorporated by reference in its entirety; and
 b. U.S. patent application Ser. No. 12/751,206, "Rack-Mounted Computer System with Shock-Absorbing Chassis", filed Mar. 31, 2010, which is incorporated by reference in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some known data centers include methods and apparatus that facilitate waste heat removal from rack systems. Moreover, some known data centers include a multiple rack systems having configurations that are non-uniform with respect to component density and usage, such that each rack system generates waste heat at a non-uniform rate as compared to other rack systems. In such data centers, application of uniform heat removal methods and apparatus to such non-uniform waste heat generation sources may not be fully efficient and effective in waste heat removal. Moreover, some such data centers rely on servers fans to produce airflow through the servers in the racks. Such fans may, however, add to the costs and complexity of the servers, and, in addition, may be inefficient and prone to failure.

As air for cooling computer systems passes through a rack system, the air may encounter flow restrictions at various openings in the rack and computer systems. In addition, the air may encounter flow restrictions as the air is forced to change direction as the air enters and exits the rack and the enclosures for the individual computer systems. Such flow restrictions tend to reduce the air flow rate through the rack, which may reduce cooling effectiveness.

Figure 1:
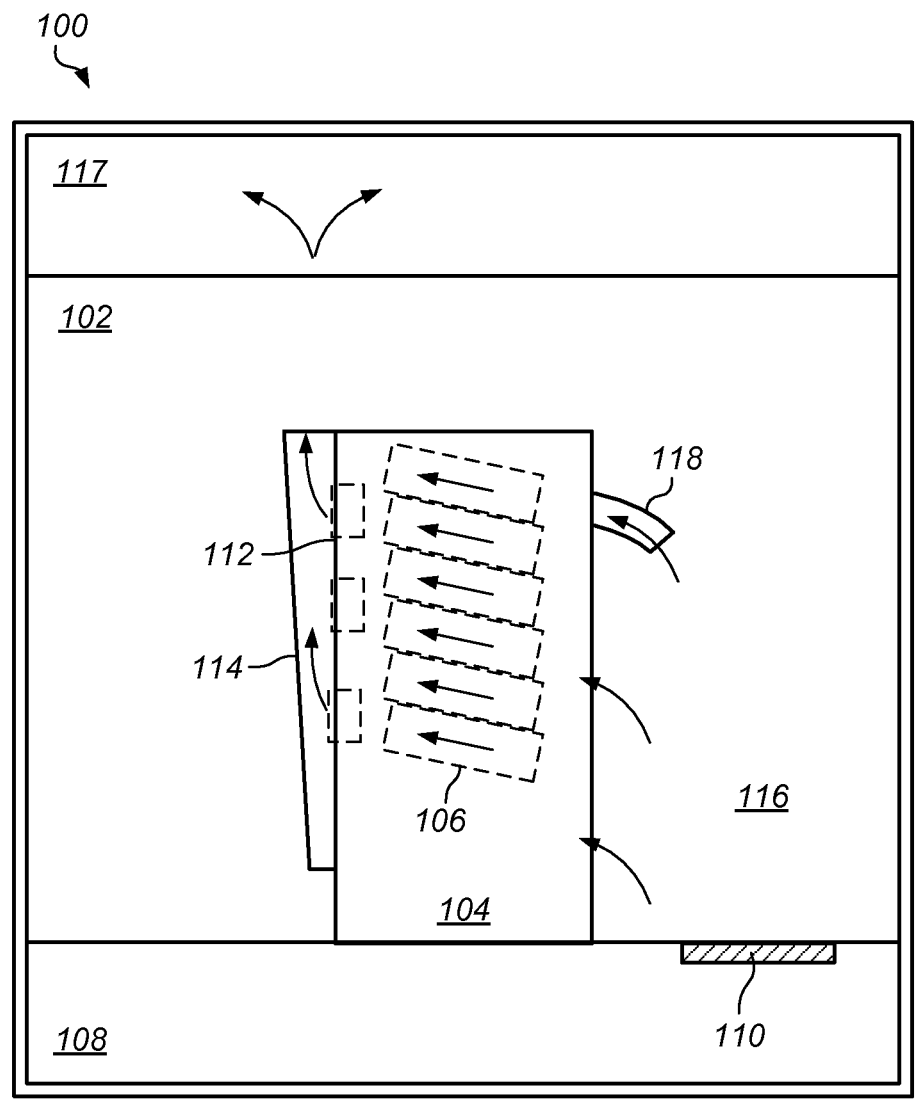
FIG. 1 illustrates one embodiment of a data center having inclined computing devices in a rack.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems and methods of cooling computing devices are disclosed. According to one embodiment, a data center includes one or more racks, one or more computing devices coupled to at least one of the racks, and one or more air moving devices. The computing devices include heat producing components. The computing devices may be inclined in the rack such that the lower ends of the computing devices are at a lower elevation than the higher ends of the computing devices. The air moving devices can move air from the lower end of the inclined computing devices to the higher end of the inclined computing devices such that heat is removed from heat producing components in the inclined computing devices.

According to one embodiment, a rack system includes a rack and one or more brackets coupled to the rack. One or more of the brackets can hold a computing device at an incline in the rack such that a lower end of the computing device is at a lower elevation than a higher end of the computing device. In some embodiments, the bracket is adjustable to change the angle of inclination of the computing device.

According to one embodiment, a method of removing heat from computing devices in a rack includes positioning computing devices in a rack at an incline such that such that a lower end of the computing device is at a lower elevation than a higher end of the computing device. Air may be moved through the inclined computing devices such that heat is removed from heat producing components in the computing device.

As used herein, "air handling system" means a system that provides or moves air to, or removes air from, one or more systems or components.

As used herein, an "aisle" means a space next to one or more racks.

As used herein, "ambient" means, with respect to a system or facility, the air surrounding at least a portion of the system or facility. For example, with respect to a data center, ambient air may be air outside the data center, for example, at or near an intake hood of an air handling system for the data center.

As used herein, a "bracket" includes any structure or element, or combination of structures and elements, that can hold or support another element. In some embodiments, for example, a computing device is supported on a pair of opposing L-brackets on either side of the computing device. A bracket may include a rail, a slide, a shelf, a plate, or a combination of one or more such elements.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, a "duct" includes any device, apparatus, element, or portion thereof, that can direct, segregate, or channel a fluid, such as air. Examples of ducts include cloth or fabric ducts, sheet metal ducts, molded ducts, tubes, or pipes. The cross sectional shape of a passageway of a duct may be square, rectangular, round or irregular, and may be uniform or change over the length of the duct. A duct may be a separately produced component or integral with one or more other components, such as a frame.

As used herein, a "free cooling" includes operation in which an air handling system pulls air at least partially from an external source (such as air outside a facility) and/or a return from a computer room, and forces the air to electronic equipment without active chilling in the air-handling subsystem.

As used herein, "installed" means in place on, or coupled to, a supporting structure or element. In some embodiments, a computer system is installed such that it can be moved on the structure to which it is mounted. For example, a server may be installed on a rail such that the server can slide along the rail.

As used herein, a "module" means a component or a combination of components physically coupled to one another. A module may include functional elements and systems, such as computer systems, racks, blowers, ducts, power distribution units, fire suppression systems, and control systems, as well as structural elements, such a frame, housing, or container. In some embodiments, a module is pre-fabricated at a location off-site from a data center.

As used herein, a "rack" means a rack, container, frame, or other element or combination of elements that can contain or physically support one or more computing devices.

As used herein, a "pin" includes any element that can be positioned to constrain or hold another element in a desired position or orientation. Suitable pins may include straight pins, pegs, threaded bolts, unthreaded bolts, bars, plates, hooks, rods, or screws.

As used herein, "room" means a room or a space of a building. As used herein, "computer room" means a room of a building in which computer systems, such as rack-mounted servers, are operated.

As used herein, "scoop" means an element, or portion thereof, that can collect, channel, receive, or direct a fluid into a passage.

As used herein, a "space" means a space, area or volume.

In some embodiments, a data center includes rack-mounted computing devices installed in one or more racks at an incline. FIG. 1 illustrates one embodiment of a data center including inclined computing devices in a rack. System 100 includes computing room 102, rack system 104, and computing devices 106. Computing devices 106 are installed in rack system 104. Computing devices 106 are supported at an incline in rack system 104. In the embodiment shown in FIG. 1, the elevation at the front end of each of computing devices 106 is lower than the elevation at the rear end of the computing device. An upward slant of computing devices 106 may promote airflow through computing devices 106, for example, by promoting natural convection of the air flowing through the computing devices.

Air may pass into computing room 102 from sub-floor plenum 108 by way of vent 110. Rear fans 112 in fan door 114 may draw air from front aisle 116 into rack system 104. Air may pass into each computing device 106 (for example, into an enclosure for the computing device) at the front of the computing device, across heat producing components of the computing device, and out through the rear of the computing device. Because of the incline of computing devices 106, the air in the computing devices rises as it flows from the front the rear of the computing devices. Rear fans 112 may exhaust heated air out of the rack. The heated air may pass into ceiling plenum 117.

Air directing device 118 is provided on the front or rack. In various embodiments, one or more air directing devices 118 may be coupled to the front rack system 104 to promote airflow in particular computing devices mounted in the rack.

In various embodiments, the angle of inclination of a computing device may be selected based on cooling requirements of the computing device. For example, a computing device for a low power server may be placed at a relatively horizontal angle, while a high power server may be placed at a relatively steep angle of inclination.

In some embodiments, air directing devices (such as air directing device 118) are located to direct air to desired locations in a particular server. The desired location may be based on the layout of heat producing components of the server. In certain embodiments, an air directing device is placed at desired location along the width of a slot in which the rack is installed. As an example, for a type of server that has sensitive electronic components on the right side and left side of the server and disk drives in the middle, one or more air directing devices may be positioned on each of the left side and right side of the slot.

In various embodiments, different air directing devices (for example, having different sized or shaped passages, orifices, or scoops), may be used in different locations, depending on cooling requirements of the computer systems in the rack. For example, an air directing device for a low power server may have a relatively small scoop and a relatively small orifice, while an air directing device for a high power server may have a relatively large scoop and a relatively large orifice. In some embodiments, the size and/or position of an opening in an air directing device may match the size of a corresponding opening in a server.

Figure 2:
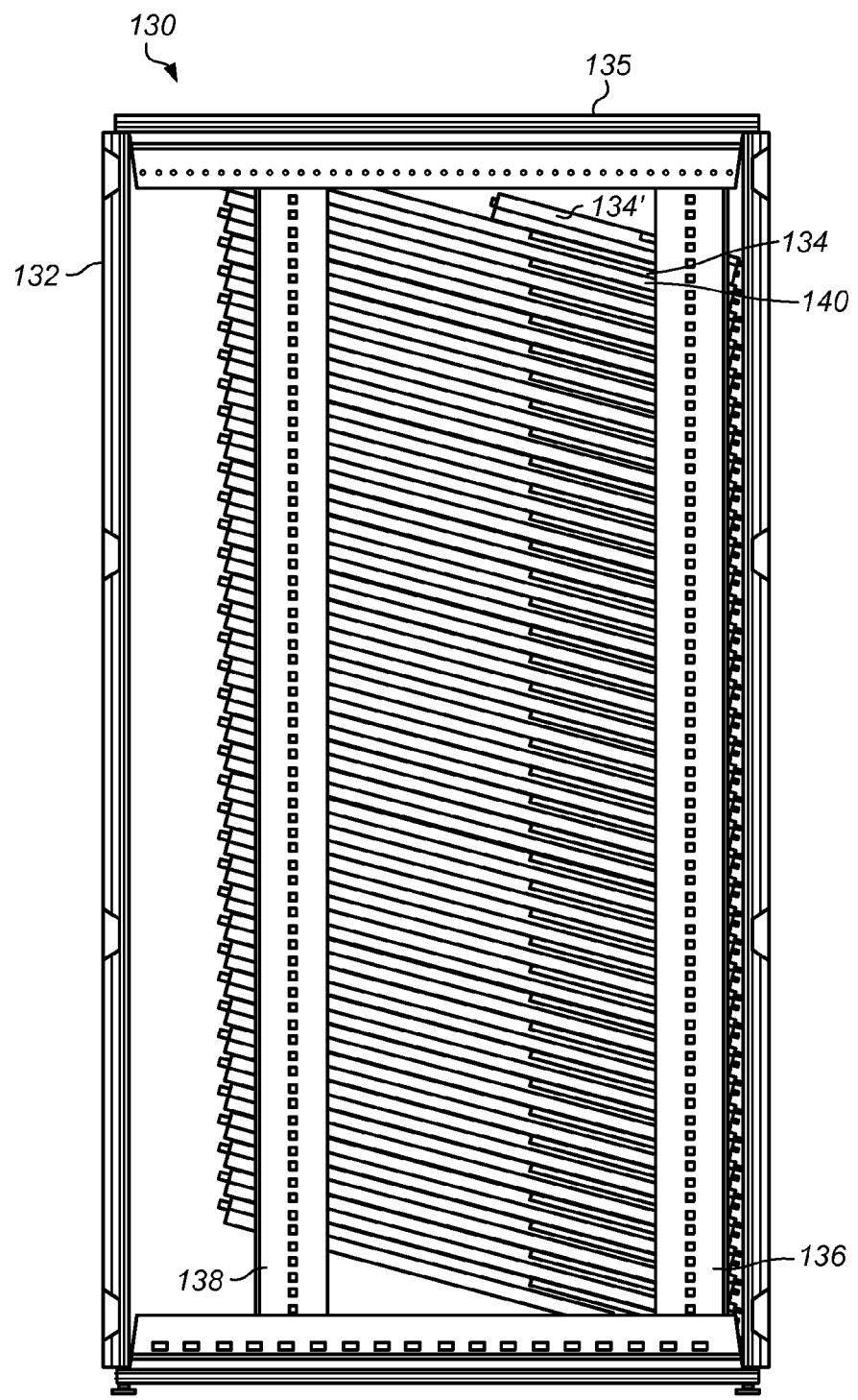
FIG. 2 is a side view illustrating one embodiment of a rack system in which computing devices are held at an incline on mounting brackets.

In some embodiments, a rack system includes brackets that can hold computing devices at an incline in a rack. FIG. 2 is a side view illustrating one embodiment of a rack system in which computing devices are held at an incline on mounting brackets. System 130 includes rack system 132 and computing devices 134. Rack system 132 includes enclosure 135, front post 136, rear post 138, and brackets 140 (the side panel of enclosure 134 is not shown) Brackets 140 may hold computing devices 134 at an incline in rack system 132. Computing devices 134 may retained in rack system 132 on brackets 140. In some embodiments, a computing device is secured by fasteners (for example, machine screws that couple left and right mounting ears on computing devices 134 to corresponding mounting elements on brackets 140). Examples of other elements and mechanisms for retaining computing devices in a rack system may include cams, wedges, springs (for example, leaf springs), and detent mechanisms.

Brackets 140 may include various elements for supporting the computing devices. Brackets 140 may be, for example, a pair of opposing side rails, slides, L-brackets, or a combination thereof. In some embodiments, brackets 140 include a shelf, a mounting plate, or a carriage. In some embodiments, a rack system includes a separate bracket or set of brackets for each computing device. In other embodiments, a single bracket or set of brackets supports more than one computing device.

The angle of inclination of computing devices 134 may be any angle between 0 and 90 degrees. In certain embodiments, the angle of inclination of computing devices in a rack is between about 0 degrees and about 25 degrees. In one embodiment, the angle of inclination of computing devices in a rack is between about 10 degrees and about 25 degrees. The angle of inclination may be fixed or adjustable.

In some embodiments, computing devices in a rack system may be different depths from one another. For example, in the embodiment shown in FIG. 2, top computing device 134' is shorter than that of computing devices 134 mounted below it. Having computing devices of different lengths within a rack may allow the space in the rack to be used more effectively.

Figure 3:
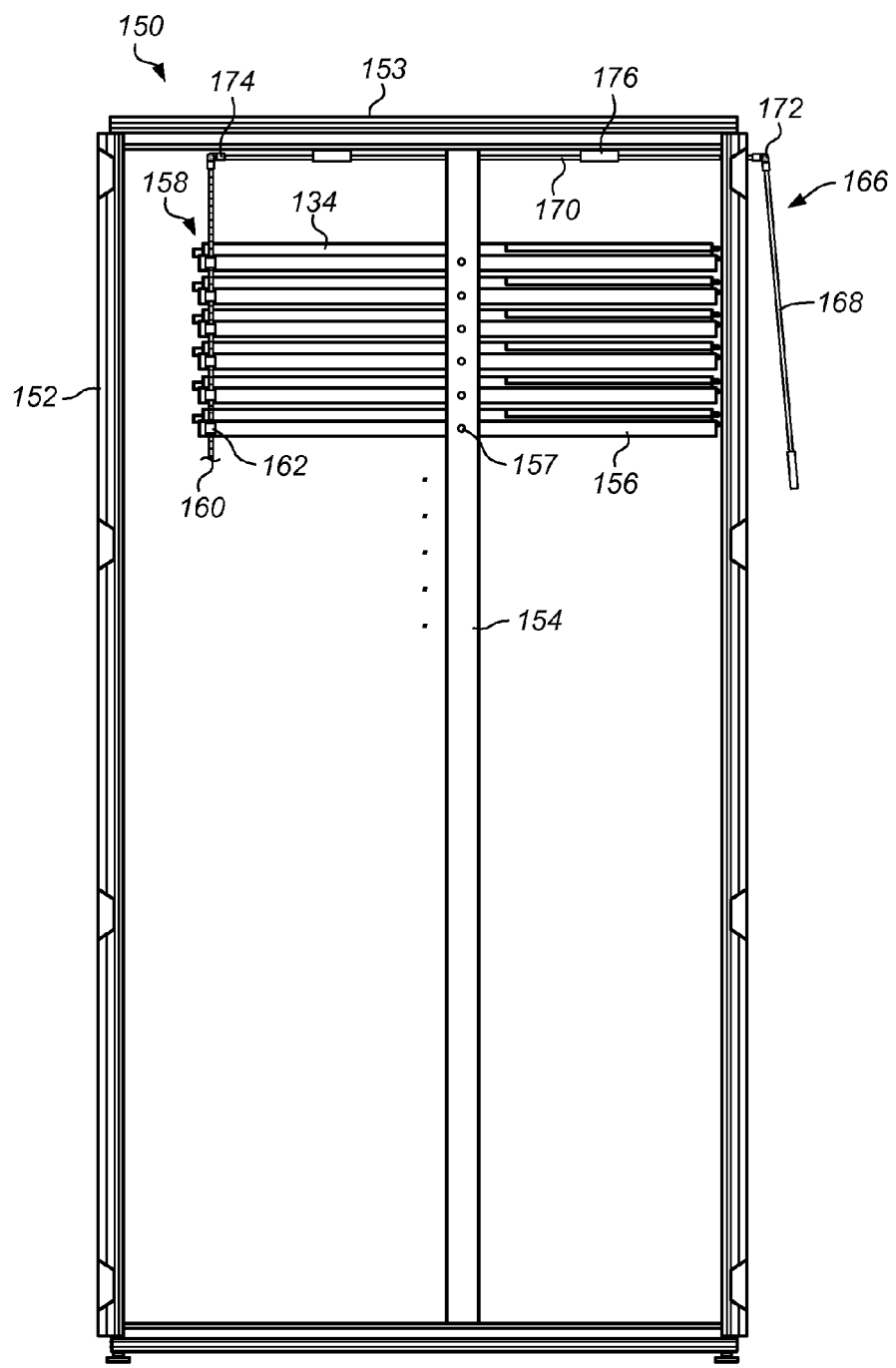
FIG. 3 is a side view illustrating one embodiment of a rack system having an incline adjustment mechanism.

In some embodiments, a rack system includes a mechanism for adjusting the incline of computing devices in the rack system. FIG. 3 is a side view illustrating one embodiment of a rack system having an incline adjustment mechanism. System 150 includes rack system 152 and computing devices 134. Rack system 152 includes enclosure 153, support posts 154, brackets 156, pins 157, and incline adjustment mechanism 158. Brackets 156 may be pivotally coupled to support post 154 on pins 157.

Figure 4:
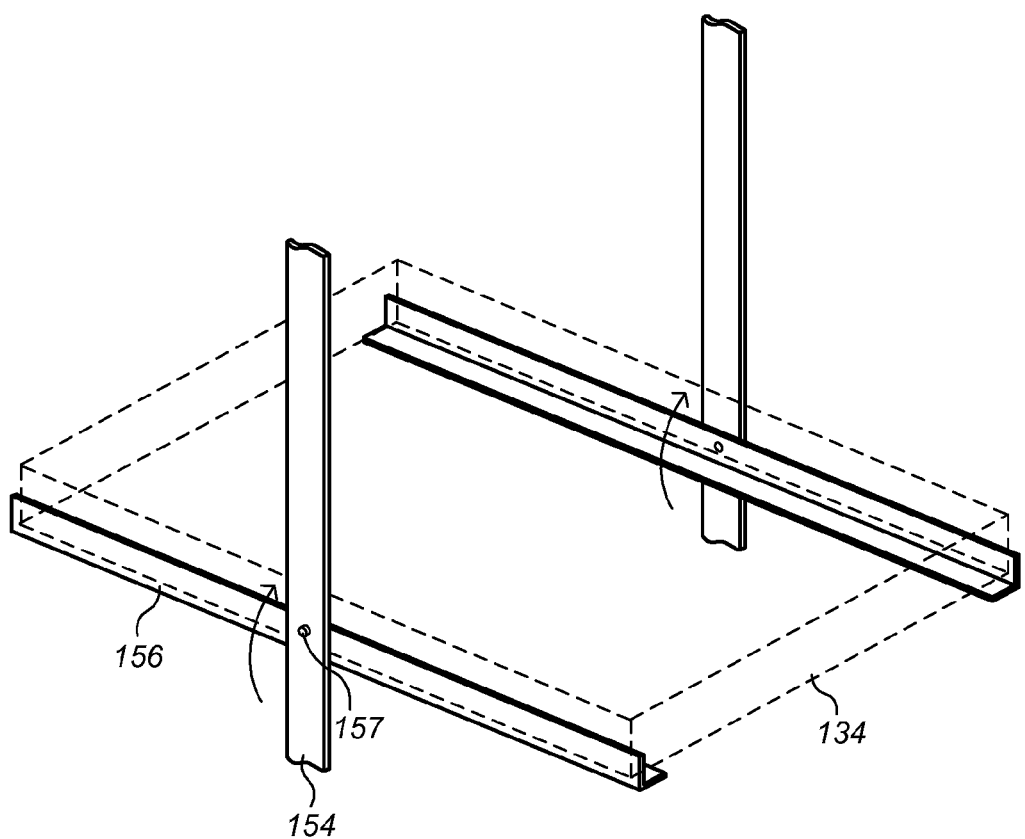
FIG. 4 illustrates one embodiment of a mounting system for a computing devices including opposing L-brackets.

Although for illustrative purposes only the left side of system 150 is shown, the opposite side of system 150 may include similar elements and construction (for example, a support post, rails, etc.) FIG. 4 illustrates one embodiment of a mounting system for a computing devices including opposing L-brackets. In the embodiment shown in FIG. 4, left and right brackets 156 are pivotally coupled to support post 154 on pins 157. Left and right brackets 156 may support computing device 134. The angle of inclination of computing device 134 may be adjusted by rotating brackets 156 in the direction of the arrows.

Referring again to FIG. 3, in the embodiment shown, support post 154 is about midway between the front and rear of computing devices 134. Support posts may, however, be at any location relative to the front and rear of computing devices in a rack. In some embodiments, the location of support posts 134 may be such that computing devices 154 are balanced with respect to a mounting point.

Incline adjustment mechanism 158 includes threaded adjustment rod 160 and coupler blocks 162. One of threaded coupler blocks 162 may be connected to each of brackets 156. Coupler bocks 162 may each include a threaded opening through the block. Threaded adjustment rod 160 may be threaded through the threaded opening in each of coupler blocks 162.

In some embodiments, the connection between coupler blocks 162 and brackets 156 is a pivotal connection, such that coupler blocks 162 can rotate with respect to brackets 156. In some embodiments, coupler blocks are coupled to brackets by way of a pivotal and slotted connection, for example, to allow for horizontal movement of the coupler blocks relative to the bracket or other elements of a mechanism. Coupler blocks 156 may pivot to remain such that coupled blocks 162 remain aligned with threaded adjustment rod 160.

Incline adjustment mechanism 158 includes control assembly 166. Control assembly 166 includes control rod 168, connecting rod 170, universal joint 172, and universal joint 174. Guides 176 are attached to the top of enclosure 153. Connecting rod 170 may rotate in guides 176. Control rod 168 is coupled to connecting rod 170 by way of universal joint 172. Connecting rod 170 is connected to threaded adjustment rod 160 by way of universal joint 174.

To operate incline adjustment mechanism 158, control rod 168 may be rotated by a user. Rotating control rod 168 may rotate connecting rod 170, which in turn may rotate threaded adjustment rod 160. As threaded adjustment rod 160 rotates, coupler blocks 162 may ride up or down threaded adjustment rod 160 due to the threaded engagement between threaded adjustment rod 160 and coupler blocks 162. As coupling blocks 162 move upward, the rear portion of each of brackets 156 may rise relative to pivot pins 157, thus increasing the angle of inclination of computing devices 134 in rack system 152. Control rod 168 may rotated as many turns as needed to achieve the desired inclination angle of computing devices 134.

In some embodiments, control rod 168 is removable. In some embodiments, control rod 168 includes a coupling device for a power tool, such as a power drill. For example, a power drill with a hex driver attachment may be coupled in a mating socket on control rod 168. In certain embodiments, an automated drive system may be used to actuate adjustment rod 160 instead of, or in addition to, the series of manually operated rods shown in FIG. 3.

Figure 5:
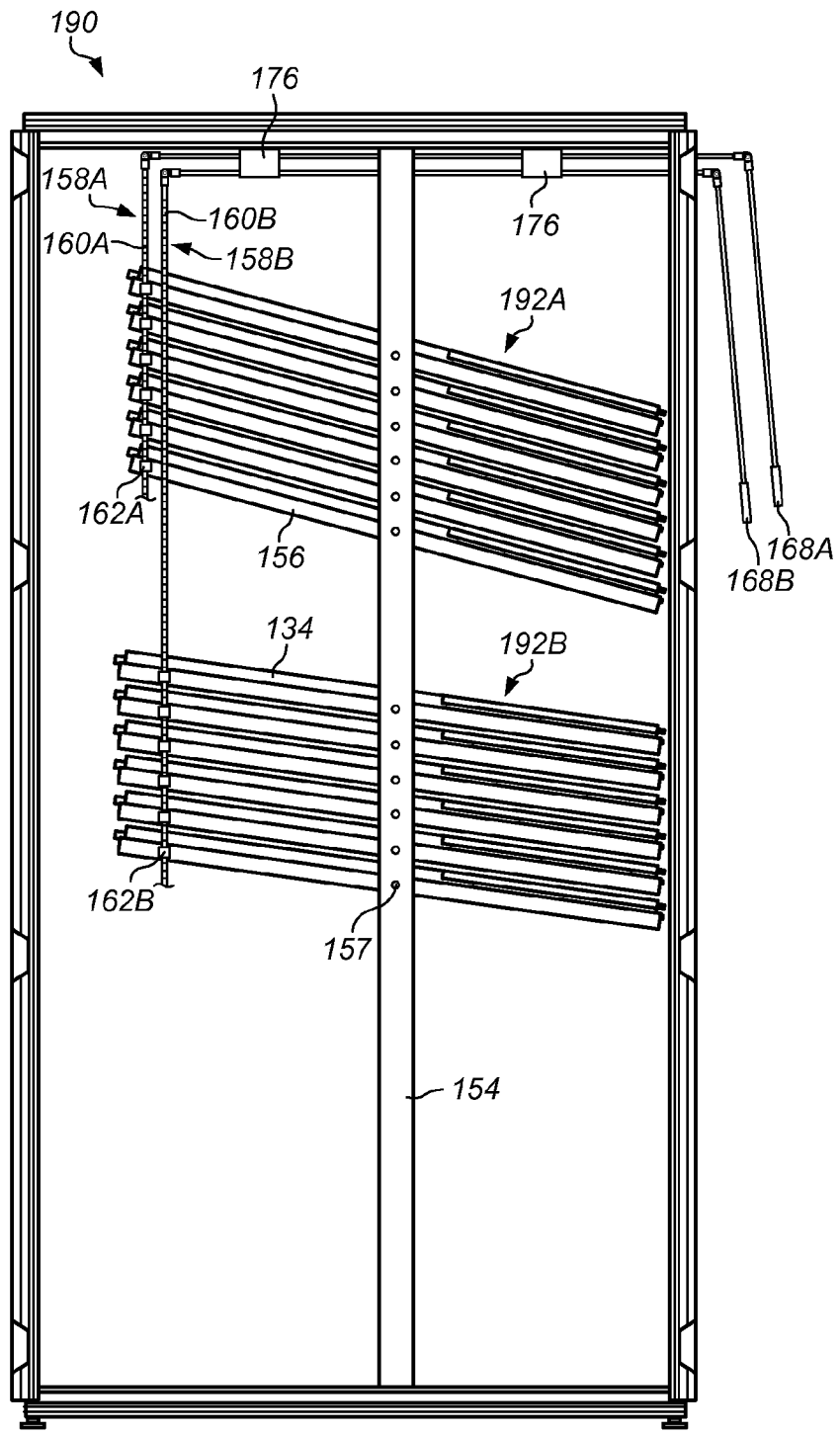
FIG. 5 illustrates one embodiment of a rack system including multiple incline adjustment mechanisms.

In some embodiments, a rack system includes two or more incline adjustment mechanisms. Each of the incline adjustment mechanisms may control incline of a different computing device, or a different set of computing devices. FIG. 5 illustrates one embodiment of a rack system including multiple incline adjustment mechanisms. System 190 includes rack system 152 and computing devices 134. Rack system 152 includes support posts 154, brackets 156, and incline adjustment mechanisms 158A and 158B. Incline adjustment mechanism 158A may be operable to adjust the angle of inclination of set 192A of computing devices 134. Incline adjustment mechanism 158B may be operable to adjust the angle of inclination of set 192B of computing devices 134. The elements of incline adjustment mechanisms 158A and 158B may be similar to those described above for incline adjustment mechanisms 158 relative to FIG. 3.

Incline adjustment mechanisms 158A and 158B may be independently adjustable such that, as illustrated in FIG. 5, the computing devices in set 192A can be placed at a different angle of inclination from the computing devices in set 192B.

Figure 6A:
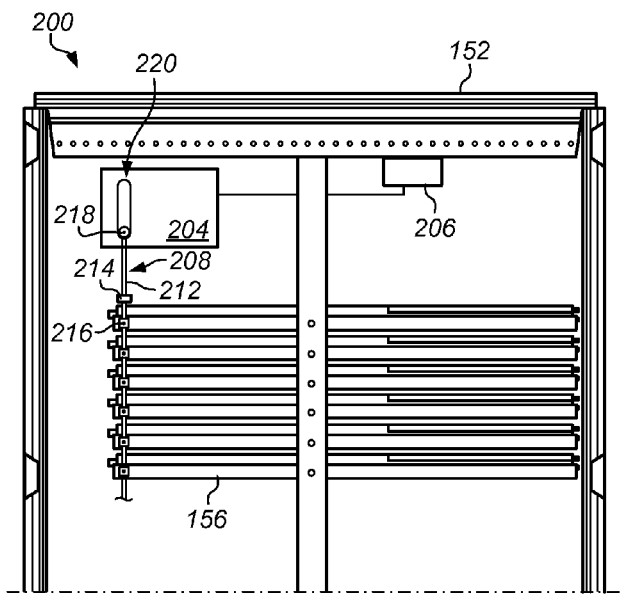
FIG. 6A is a side view illustrating an embodiment of an incline adjustment mechanism for rack-mounted computing devices, with an automatic control system.
Figure 6B:
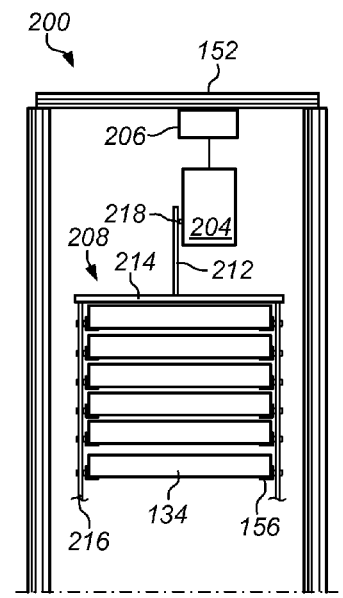
FIG. 6B is an end view illustrating an embodiment of an incline adjustment mechanism for rack-mounted computing devices, with an automatic control system.

In some embodiments, the angle of inclination of one or more computing devices in a rack is performed automatically. FIG. 6A is a side view illustrating an embodiment of an incline adjustment mechanism for rack-mounted computing devices with an automatic control system. FIG. 6B is an end view illustrating an embodiment of an incline adjustment mechanism for rack-mounted computing devices with an automatic control system. System 200 includes rack system 152, computing devices 134, and incline adjustment mechanism 202. Mounting of computing devices 134 may be similar to that described in FIGS. 3 and 4.

Incline adjustment mechanism 202 includes drive system 204, control system 206, linkage 208, and coupler blocks 210. Linkage 208 includes master link 212, yoke 214, and side links 216. Yoke 214 connects side links 216 to master link 212. Each of side links 216 may be coupled to coupler blocks 210, which are in turn coupled to brackets 156.

Master link 212 of linkage 208 is coupled to drive pin 218 of drive system 204. Drive system 204 may include any suitable mechanisms and components for moving drive pin 218 up or down in slot 220 of drive system 204. A drive mechanism may include, for example, an electric motor, a gear box, chain drive, or linear actuator, or combinations thereof. In certain embodiments, a mechanism provides a pneumatic or hydraulic assist for inclining computing devices in a rack.

Control system 206 is coupled to drive system 204. Control system 206 may include a programmable logic controller. Control system 206 may be operable to control drive system 204 to adjust the angle of inclination of computing devices 134.

Figure 6C:
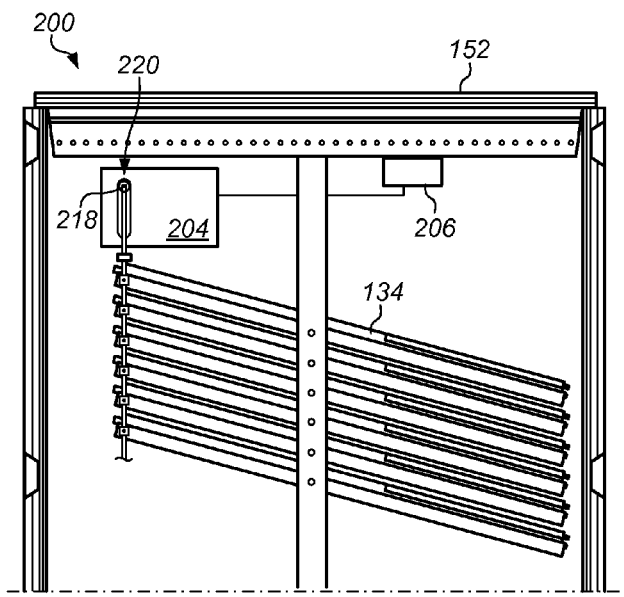
FIG. 6C illustrates an embodiment of a rack system after a drive system has been operated to incline computing devices in a rack.

FIG. 6C illustrates an embodiment of a rack system after a drive system has been operated to incline computing devices in a rack. As drive pin 218 moves up in slot 220, the rear ends of computing devices 134 are raised such that computing devices 134 are inclined in rack system 152, such as shown in FIG. 6C.

In the embodiment shown in FIGS. 6A, 6B, and 6C, the incline adjustment mechanism includes a common control for both adjustment rods. Nevertheless, a rack system may in various embodiments have separate control elements for two or more different mechanisms in the rack. For example, adjustments rods on the left and right sides of a rack system may each be operated by a separate drive system or control handle.

Figure 7:
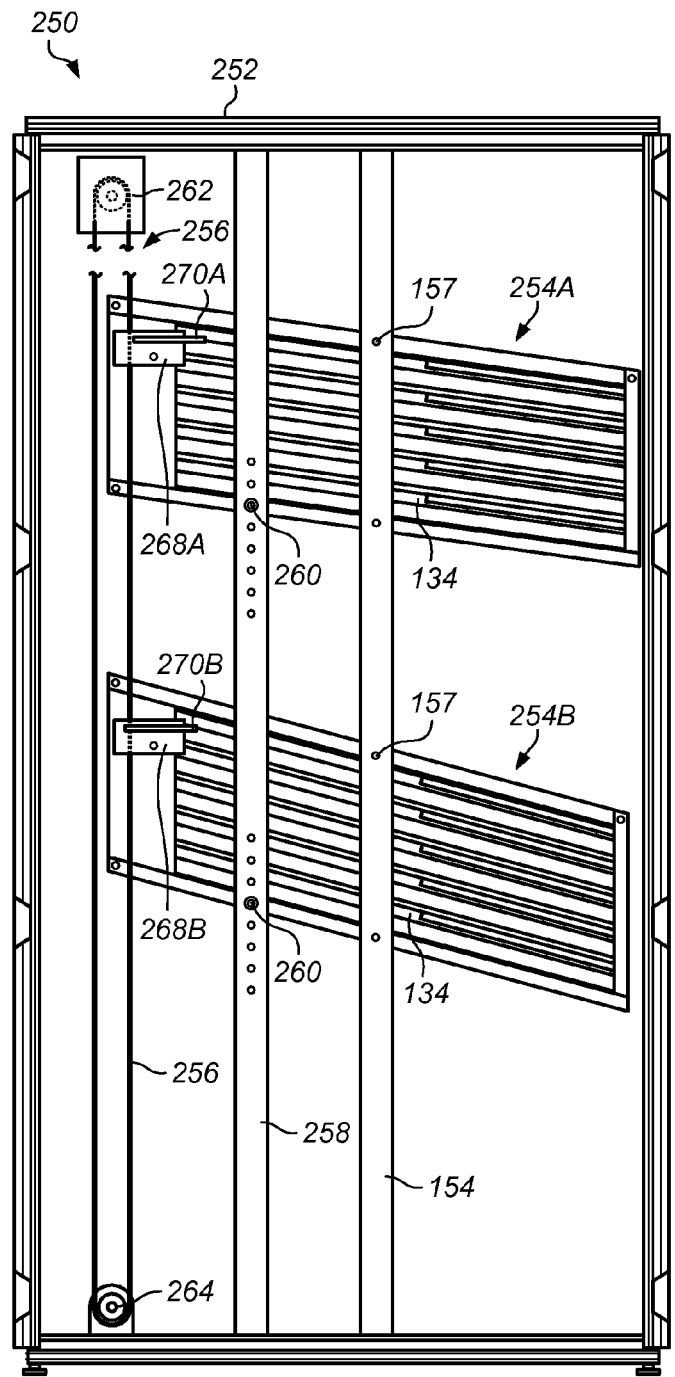
FIG. 7 illustrates one embodiment of a rack system including an incline adjustment mechanism and latching devices for setting the inclination angle of computing devices in a rack.

In some embodiments, a rack system includes one or more latch devices for holding computing devices at desired angles of inclination. FIG. 7 illustrates one embodiment of a rack system including an incline adjustment mechanism and latching devices for establishing and setting the inclination angle of computing devices in a rack. System 250 includes rack system 252 and computing devices 134. Rack system 252 includes support posts 154, server carriages 254A and 254B, incline adjustment mechanism 256, and latch rail 258. Incline adjust mechanism 256 may be operable to adjust the inclination of servers in server carriages 254A and 254B.

Each of server carriages 254A and 254B includes latch pins 260. Latch pins 260 can be selectively engaged in one of holes in latch rail 258. Engagement of latch pin 260 may fix servers in a server carriage at a desired angle of inclination.

Incline adjustment mechanism 256 includes drive 262, bottom pulley 264, chain 266, and trolleys 268A and 268B. Trolley 268A is pivotally coupled to server carriage 254A. Trolley 268B is pivotally coupled to server carriage 254B. Pin 270A in trolley 268A and pin 270B in trolley 268B may each be selectively engaged with chain 266. When pin 270A is engaged on chain 266, drive 262 can be operated to raise or lower the rear end of server carriage 254A. When pin 270B is engaged on chain 266, drive 262 can be operated to raise or lower the rear end of server carriage 254B. Thus, each of server carriages 254A and 254B can be raised or lowered while the trolley for the other server carriage disengaged and the server carriage latched at a fixed angle of inclination. In this manner, each set of servers can be independently placed at a different angle of inclination.

Figure 8:
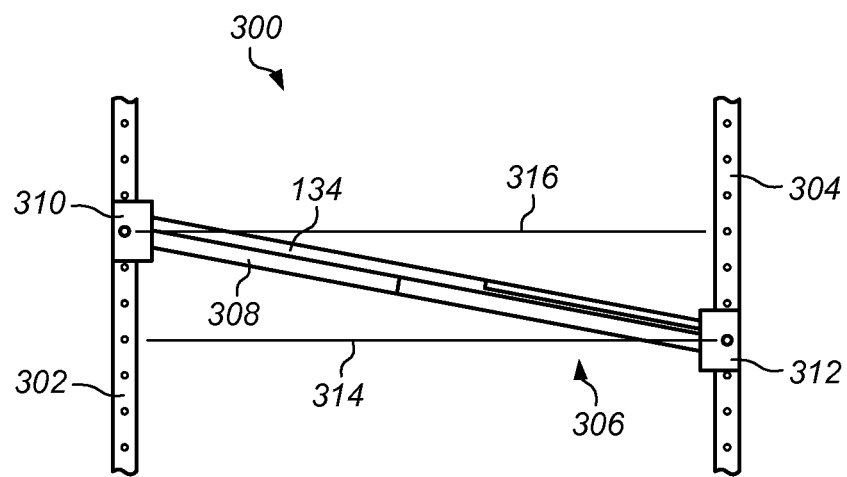
FIG. 8 is a side view illustrating a bracket for an inclined mounting on standard front and rear vertical rails.

In some embodiments, brackets for inclined mounting of a computing device may couple on standard rack elements. FIG. 8 is a side view illustrating a bracket for an inclined mounting on standard front and rear vertical rails. Rack system 300 includes rear vertical rail 302, front vertical rail 304, and incline bracket assembly 306. Incline bracket assembly 306 includes telescoping rail 308, rear mounting plate 310, and front mounting plate 312. Rear mounting plate 310 and front mounting plate 312 may be pivotally couple to telescoping rail 308. Rear mounting plate 310 may be attached to rear vertical rail 302 at height 316. Front mounting plate 312 may be attached to front vertical rail 304 at height 314. The relatively greater installed height of rear mounting plate 310 results in an upward slope of rail 308. Computing device 134 may be installed on rail 308. In some embodiments, the magnitude of incline of a computing device is controlled by the difference between the mounting heights of the front and rear elements of a bracket assembly. For example, mounting plates installed at a 2U height spacing may have one half the angle of inclination as mounting plates installed at a 4U height spacing.

Figure 9:
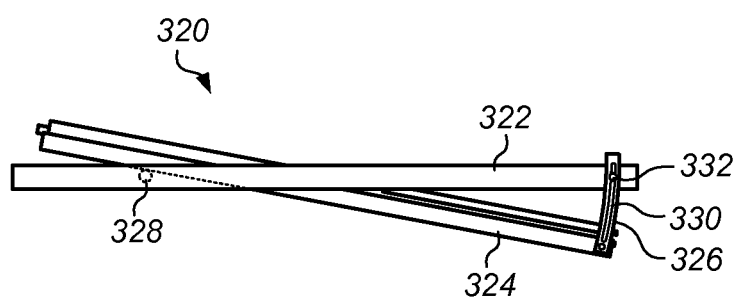
FIG. 9 illustrates an embodiment of a bracket assembly with an adjustable angle between a rail and a support bracket for a computing device.

FIG. 9 illustrates an embodiment of a bracket assembly with an adjustable angle between a rail and a support bracket. Bracket assembly 320 includes rail 322, bracket 324, and strap 326. The rear portion of bracket 322 may rest on cross pin 328. Strap 326 includes slot 330. Thumb screw 332 may pass through slot 330 and engage threads in rail 322. Slot 330 allows angular adjustment of bracket 324 relative to rail 322, such that the angle of inclination of a computing device on bracket 324 can be changed. In various other embodiments, other devices may be used for adjusting or setting an angle of inclination, including pins, ¼ turn screws, or twist lock devices.

Although in the embodiment shown in FIG. 1, air moving devices are located in the rear door of the rack, air moving devices may be located in any suitable location. In certain embodiments, air moving devices are located in one or more of the computing devices. In some embodiments, air moving device are located outside of a computer room. In certain embodiments, a rear door of a rack includes an air directing device with louvers, such as described in U.S. patent application Ser. No. 12/646,417, "Air Directing Device for Rack System", filed Dec. 23, 2009, which is incorporated by reference as if fully set forth herein. Other arrangements of air movers may be included in various embodiments. U.S. patent Ser. No. 12/751,212, "Rack-Mounted Air Directing Device with Scoop", filed Mar. 30, 2010; and U.S. patent application Ser. No. 12/886,440, "System with Rack-Mounted AC Fans", filed Sep. 9, 2010, each of which is incorporated by reference as if fully set forth herein, include other arrangements, systems, devices, and techniques that may be used in various embodiments for cooling or mounting computing modules, data storage modules and data control modules.

In some embodiments, cooling rack-mounted computing devices includes inclining the computing devices in the rack. Air may be introduced into the computing devices at the lower end of the computing devices and discharged at the higher end of the computing devices.

In some embodiments, computing devices are at an incline as initially installed in the rack. For example, the computing devices may be installed on inclined mounting brackets. In other embodiments, computing devices are initially installed horizontally, and then tilted after installation to a desired angle of inclination.

In some embodiments, the angle of inclination of a computing device is determined based on cooling requirements for one or more computing devices in a rack. In certain embodiments, the angle of inclination of a computing device is adjusted based on measurements of one or more operating characteristics in a computing device, rack, or data center. Such operating characteristics include ambient temperature, exit air temperature, flow rate, pressure, and humidity.

Figure 10:
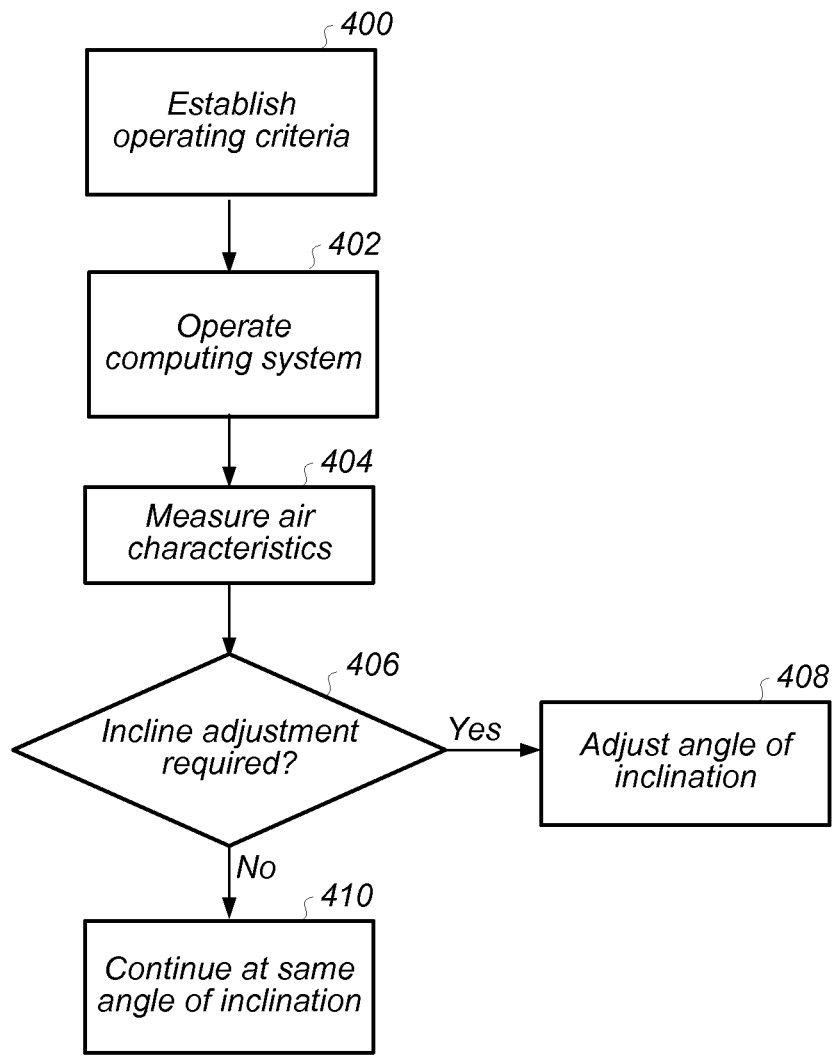
FIG. 10 illustrates one embodiment of adjusting the angle of inclination of computing devices in a rack system based on measured characteristics of air.

FIG. 10 illustrates one embodiment of adjusting the angle of inclination of computing devices in a rack system based on measured characteristics of air. At 400, operating criteria for rack-mounted computing devices are established. The operating criteria may include, for example, a target operating temperature range for the computing devices in the rack system.

At 402, the computing devices are operated in a computer room. At 404, one or more characteristics of air in the computer room are measured while the system operates. In one embodiment, the measured characteristics include an airflow rate of air in one or more of the computing devices. In other embodiments, the measured characteristics include an airflow rate of air flowing through the rack. Other measured characteristics include temperature, pressure, or humidity of air in various locations.

At 406, a determination is made whether to adjust an angle of inclination of computing devices based on the measured characteristics and the operating criteria. If the measured characteristics of air and the operating criteria indicate that an adjustment is required, the angle of inclination of one or more computing devices is adjusted at 408. For example, if the flow rate through the computing devices is too low, an angle of inclination may be increased. If the measured characteristics of air and the operating criteria indicate that an adjustment is not required, operation is continued at the same angle of inclination at 410. Adjustment of the angle of inclination of computing devices may be accomplished manually, automatically, or a combination thereof.

In certain embodiments, computing devices may be added or removed in conjunction with changing the angle of inclination of computing devices in a rack. For example, if conditions require that computing devices be placed at a steep angle, some computing devices may need to be removed to allow for the remaining computing devices to be placed at the steeper angle. If conditions allow for computing devices to be placed at a smaller angle of inclination or horizontally, space may be freed up for adding additional computing devices.

In various embodiments shown in FIGS. 1-6, the incline adjustment mechanisms change the angle of the computing devices by pulling up from above on mounting elements in the rear part of the computing device. Forces to change an inclination of a computing device may, however, be applied in various embodiments at any suitable location and in any suitable direction. For example, a force to change the angle of inclination of a computing device may be applied by a link pushing on the rear of the computing device from below the computing device. As another example, a force to change the angle of inclination of a computing device may be applied downwardly at or near the front of the computing device.

Although in various embodiments shown in FIGS. 1-6, incline adjustment mechanism included a pivotal mounting for the computing device, incline adjustment mechanisms may, in various embodiments, have other mounting arrangements. For example, a computing device may be supported on front and rear horizontal cross bars, one or both of which can be raised or lowered relative to the other horizontal cross bar (for example, a cross bar supporting one or more computing devices at the front of the devices may be lowered relative to a cross bar at the rear of the computing devices).

In some embodiments, forces may be exerted on both the front and the rear of a computing device (for example, a front link pushing down on the front of a computing device and a rear link pulling up on the rear of a computing device). In certain embodiments, the force to change the inclination of a computing device may be applied directly to the computing device (instead of, for example, to brackets or other mounting elements for the computing device).

Although in the embodiments described above, some of the computer modules have been shown as being about 1U in height, modules may in various embodiments be 2U, 3U, 4U, or any other height or dimensions.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A data center, comprising:
one or more racks, each of the one or more racks including a front end;
one or more servers coupled to at least one of the racks, wherein the one or more servers each comprise heat producing components mounted in an enclosure of the server,
wherein the enclosure of at least one of the servers is inclined in the rack such that a lower end of the at least one server is proximate to the front end of the rack and is at a lower elevation than a higher end of the at least one server; and
one or more air moving devices configured to move air from the front end of the rack and into the enclosure of the at least one inclined server such that air passes through the at least one inclined server from the lower end of the at least one inclined server to the higher end of the at least one inclined server, to remove heat from at least some of the heat producing components in the at least one inclined server, wherein the enclosure of the at least one inclined server is inclined such that the enclosure is aligned with a direction of airflow through the rack.

2. The data center of claim 1, wherein at least one of the air moving devices is external to the one or more servers.

3. The data center of claim 1, wherein at least one of the air moving devices is coupled to one of the racks, wherein the at least one air moving device is configured to move air through two or more servers in the rack.

4. The data center of claim 1, further comprising at least one air directing device coupled to at least one of the racks, wherein the at least one air directing device is configured to direct air into at least one rack holding at least one inclined server.

5. The data center of claim 1, further comprising one or more air directing devices coupled to at least one of the racks, wherein at least one of the air directing devices comprises one or more louvers, wherein the air directing device is configured to direct air that has exited at least one inclined server through the louvers and out of the rack.

6. The data center of claim 1, wherein at least one inclined server in the rack is inclined at a different angle of inclination than another inclined server in the rack.

7. The data center of claim 1, wherein an angle of inclination of the at least one inclined server corresponds to an angle of inclination of at least a portion of an airflow between the front end of the rack and the lower end of the at least one inclined server.

8. A rack system, comprising:
a rack that includes a front end;
one or more brackets coupled to the rack, wherein
at least one of the brackets is configured to couple with an enclosure of a server and hold the server at an incline in the rack such that a lower end of the server is proximate to the front end of the rack and is at a lower elevation in the rack than a higher end of the server; and
the server, wherein the server is configured to allow air into the enclosure such that air passes through the server from the lower end of the server to the higher end of the server, to remove heat from one or more heat producing components in the server, and wherein the enclosure of the server is inclined such that the enclosure is aligned with a direction of airflow through the rack.

9. The rack system of claim 8, wherein the one or more brackets comprises a pair of opposing L-brackets, wherein each of the opposing L-brackets is configured to support one side of an enclosure of a server.

10. The rack system of claim 9, wherein each L-bracket of the pair of opposing L-brackets is pivotally coupled to the rack.

11. The rack system of claim 8, wherein at least of the one or more brackets has a fixed angle of inclination relative to the rack.

12. The rack system of claim 8, wherein at least one of the one or more brackets is configured to couple with one or more horizontal rails in a rack and to hold one or more servers at an incline relative to the horizontal rails.

13. The rack system of claim 8, wherein at least one of the brackets is configured to couple with a front post at a first elevation and to couple with a rear post at a second elevation that is higher than the first elevation.

14. The rack system of claim 8, further comprising at least one latch mechanism configured to selectively hold at least one of the brackets at a fixed angle of inclination.

15. The rack system of claim 8, further comprising at least one retention device configured to retain one or more servers in the rack.

16. The rack system of claim 8, wherein a first set of one or more servers in the rack are inclined at a different angle of inclination than a second set of one or more servers in the rack.

17. A method of removing heat from servers in a rack, comprising:
positioning an enclosure of a server in a rack at an incline such that a lower end of the server is proximate to a front end of the rack and is at a lower elevation than a higher end of the server; and
moving air from the front end of the rack and into the enclosure of the inclined server such that air passes through the inclined server from the lower end of the inclined server to the higher end of the inclined server, to remove heat from heat producing components in the inclined server, wherein the enclosure of the inclined server is inclined such that the enclosure is aligned with a direction of airflow through the rack.

18. The method of claim 17, wherein moving air through the inclined server comprises operating at least one air moving device external to the inclined server.

19. The method of claim 17, further comprising positioning an enclosure of an additional server at an incline in the rack, wherein the additional server is positioned at a different angle of inclination than the inclined server.

20. The method of claim 17, wherein positioning the enclosure of the server in the rack at an incline in the rack comprises:
measuring at least one characteristic of air in a data center; and positioning the enclosure of the server at an angle of inclination based, at least in part, on the at least one measured characteristic of air.

\* \* \* \* \*